United States Patent
Kim et al.

(10) Patent No.: US 11,600,680 B2
(45) Date of Patent: Mar. 7, 2023

(54) ORGANIC LIGHT EMITTING DISPLAY DEVICE FOR PREVENT DISTORTION OF REFERENCE VOLTAGE

(71) Applicant: LG Display Co., Ltd., Seoul (KR)

(72) Inventors: Young-Ho Kim, Paju-si (KR); Il-Gi Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 476 days.

(21) Appl. No.: 16/715,838

(22) Filed: Dec. 16, 2019

(65) Prior Publication Data

US 2020/0194536 A1    Jun. 18, 2020

(30) Foreign Application Priority Data

Dec. 17, 2018  (KR) .................. 10-2018-0163438

(51) Int. Cl.
  H01L 27/32   (2006.01)
  G02F 1/1333  (2006.01)
  G09G 3/3233  (2016.01)
  G09G 3/3208  (2016.01)

(52) U.S. Cl.
  CPC ...... *H01L 27/3276* (2013.01); *G02F 1/13338* (2013.01); *G09G 3/3233* (2013.01); *H01L 27/3211* (2013.01); *H01L 27/3262* (2013.01); *G09G 3/3208* (2013.01); *G09G 2300/0452* (2013.01)

(58) Field of Classification Search
  CPC .......... H01L 27/3276; H01L 27/3211; H01L 27/3262; H01L 27/3213; G02F 1/13338; G09G 3/2333; G09G 3/3208; G09G 2300/0452; G09G 2300/043; G09G 2310/021; G09G 2320/0209; G09G 2320/029; G09G 2330/028
  See application file for complete search history.

(56) References Cited

U.S. PATENT DOCUMENTS

| | | | |
|---|---|---|---|
| 2015/0187276 A1* | 7/2015 | Shim | G09G 3/3291 345/77 |
| 2016/0286622 A1* | 9/2016 | Gai | H05B 45/60 |
| 2017/0038898 A1* | 2/2017 | Kim | G06F 3/0412 |

(Continued)

FOREIGN PATENT DOCUMENTS

| CN | 104637443 A | 5/2015 |
|---|---|---|
| CN | 106448558 A | 2/2017 |

(Continued)

OTHER PUBLICATIONS

Chinese Office Action dated Dec. 31, 2021 issued in counterpart Patent Application No. 201911298401.9 w/English Translation (13 pages).

*Primary Examiner* — David Tung
(74) *Attorney, Agent, or Firm* — Polsinelli PC

(57) ABSTRACT

The organic light emitting display device comprises a display panel having a plurality of gate lines and data lines for defining a plurality of sub-pixels; an organic light emitting device in each sub-pixel; a driving thin film transistor in each sub-pixel; a plurality of reference voltage lines in the display panel to apply a reference voltage to the sub-pixels in the display panel; and a VSS electrode connected to the reference voltage lines in the one side of the display panel to apply a VSS voltage to the reference voltage lines.

21 Claims, 7 Drawing Sheets

(56) References Cited

U.S. PATENT DOCUMENTS

2017/0294166 A1* 10/2017 Kim ................... G09G 3/3291
2020/0035159 A1* 1/2020 Lin ..................... G09G 3/3233

FOREIGN PATENT DOCUMENTS

| CN | 107016965 A | 8/2017 |
| CN | 107068065 A | 8/2017 |
| CN | 107799040 A | 3/2018 |
| KR | 10-2016-0078692 A | 7/2016 |

* cited by examiner

ORGANIC LIGHT EMITTING DISPLAY DEVICE FOR PREVENT DISTORTION OF REFERENCE VOLTAGE

CROSS-REFERENCE TO RELATED APPLICATION

This application claims the benefit of earlier filing date of and the right of priority from Korean Applications No. 10-2018-0163438, filed on Dec. 17, 2018, the content of which is hereby incorporated by reference in its entirety.

BACKGROUND

Field of the Disclosure

The present disclosure relates to a touch sensing system and a display device including the same.

Description of the Background

Among the various flat panel display devices proposed in recent years, an organic light emitting display device includes an organic light emitting diode (OLED) which emits light by itself. The organic light emitting display device has advantages of fast response speed, high luminous efficiency, high luminance, and wide viewing angle.

In the organic light emitting display device, organic light emitting diode is disposed in each of a plurality of sub-pixels arranged in a matrix and the luminance of the sub-pixel is controlled by the grey level of video data. In each of the sub-pixels, a driving thin film transistor (TFT) is disposed to control the driving current supplied to the organic light emitting diode in order to control the luminance of the organic light emitting display device.

In the organic light emitting display device, however, there is a difference in electrical characteristics, e.g., threshold voltage and electron mobility, between a plurality of the driving TFTs because of the various factors such as processing error and processing tolerance, thereby the image quality of the organic light emitting display device is deteriorated.

In order to prevent the deterioration of the image quality, the deviation of the electrical characteristics of the driving TFT should be compensated at the outside of the pixel region in the organic light emitting display device. The differences of the electrical characteristics of the driving TFT disposed in each of the sub-pixels are first sensed. The input digital video data are compensated according to the sensing value of the driving TFT and then the compensated digital video data are supplied to the sub-pixel to compensate the electrical characteristics.

The amount of light emitted from the organic light emitting diode is proportional to the magnitude of the driving current applied and the driving current is determined by the difference between the compensation data voltage applied to the gate electrode of the driving TFT in each pixel region and the reference voltage applied to the source electrode of the driving TFT.

Since the reference voltage is a reference for determining the voltage between the gate and the source of the TFT, the level of the reference voltage must always remain uniform. However, the reference voltage cannot be kept uniform and is distorted, resulting in horizontal crosstalk, and there is a limit in improving image quality due to the distortion of the reference voltage.

SUMMARY

Accordingly, the present disclosure is to connect a plurality of reference voltage lines to a VSS electrode to which a low potential voltage or a ground voltage is applied to ground or float the reference voltage lines during the driving and sensing periods of the organic light emitting diode, and thus the plurality of reference voltage lines. It is an object to provide an organic light emitting display device that can maintain a uniform level.

In order to achieve this aspect, the organic light emitting display device comprises a display panel having a plurality of gate lines and data lines for defining a plurality of sub-pixels; an organic light emitting device in each sub-pixel; a driving thin film transistor in each sub-pixel; a plurality of reference voltage lines in the display panel to apply a reference voltage to the sub-pixels in the display panel; and a VSS electrode connected to the reference voltage lines in the one side of the display panel to apply a VSS voltage to the reference voltage lines.

The sub-pixels are driven in a Double Rate Driving mode (DRD-mode) that neighboring two sub-pixels are connected to one data line and two gate lines. The sub-pixels may include R (Red), G (Green), and B (Blue) sub-pixels and includes R (Red), G (Green), B (Blue), and W (White) sub-pixels.

A plurality of reference voltage controlling thin film transistors are disposed respectively at the references voltage lines.

The reference voltage controlling thin film transistor is turned on to ground the reference voltage controlling line when the driving thin film transistor is driven and the reference voltage controlling thin film transistor is turned off to float the reference voltage controlling line when the driving thin film transistor is not driven.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
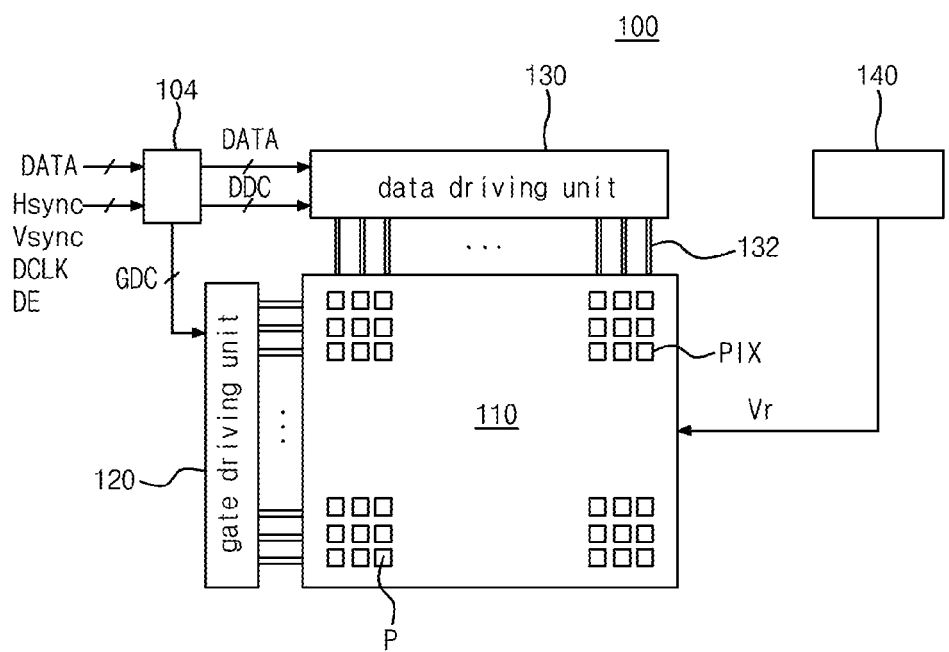
FIG. 1 is a conceptual view of an organic light emitting display device according to a first aspect of the disclosure.

Hereinafter, exemplary aspects of the present disclosure will be described in detail with reference to the accompanying drawings. It should be understood that the present disclosure is not limited to the following aspects and may be embodied in different ways, and that the aspects are given to provide complete disclosure of the present disclosure and to provide thorough understanding of the present disclosure to those skilled in the art. The scope of the present disclosure is limited only by the accompanying claims and equivalents thereof.

In the drawings, the shapes, sizes, ratios, angles, and the number of components are provided for illustration only and do not limit the scope of the present disclosure. The same components will be denoted by the same reference numerals throughout the specification. Detailed description of known functions and constructions which can unnecessarily obscure the subject matter of the present disclosure will be omitted. The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. As used herein, the singular forms "a", "an" and "the" are intended to include the plural forms as well, unless the context clearly indicates otherwise.

Unless stated otherwise, a margin of error is considered in analysis of components.

In description with spatially relative terms, for example, when an element is referred to as being disposed "on," "above," "below," or "beside" another element or layer, the element can be directly "on," "above," "below," or "beside" the other element or intervening elements may be present, unless stated otherwise.

In description of operations with temporal terms, for example, "after," "subsequent to," "before," or "followed by", the operations may be continuously or discontinuously performed, unless stated otherwise.

Although the terms "first", "second", "A", "B", etc. may be used herein to describe various elements, components and/or regions, these elements, components and/or regions should not be limited by these terms. These terms are only used to distinguish one element, component or region from another element, component or region. Thus, a "first" element or component discussed below could also be termed a "second" element or component, or vice versa, without departing from the scope of the present disclosure Features of various aspects of the present disclosure can be partially or entirely coupled to or combined with each other to realize various technical associations and operations and can be realized independently of each other or in association with each other.

Hereinafter, the disclosure will be described in detail accompanying drawings.

Figure 2:
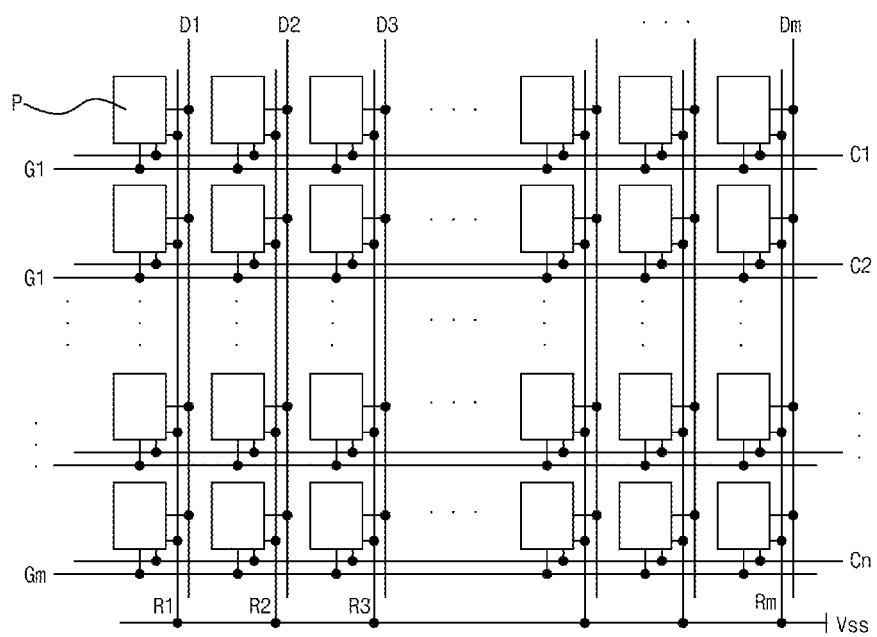
FIG. 2 is a view showing an arrangement of the pixels in the organic light emitting display device according to the first aspect of the disclosure.

FIG. 1 is a conceptual view of an organic light emitting display device 100 according to a first aspect of the disclosure and FIG. 2 is a view showing an arrangement of the pixels P in the display panel of FIG. 1.

As shown in FIGS. 1 and 2, the organic light emitting display device includes a display panel 110, a timing controller 104, a gate driving unit 120, a data driving unit 130, and a reference voltage controlling unit 140.

The display panel 110 includes a plurality of pixel P of nxm (where n and m are natural number of 2 or more) defined by a plurality of data lines D1, D2 . . . Dm and gate lines G1,G2 . . . Gn crossing each other. In the display panel 110, a plurality of reference voltage lines R1, R2 . . . Rm and sensing lines C1, C2 . . . Cn.

The data lines D1, D2 . . . Dm, the gate lines G1, G2 . . . Gn, the reference voltage lines R1, R2 . . . Rm and the sensing lines C1, C2 . . . Cn are connected to each pixel P. The data voltage is supplied to the pixel P through the data line D1, D2 . . . Dm and the reference voltage is supplied to the pixel P through the reference voltage lines R1, R2 . . . Rm. The gate signal is supplied to the pixel P through the gate lines G1, G2 . . . Gn and the sensing signal is supplied to the pixel P through the sensing lines C1, C2 . . . Cn.

Although not shown in the drawings, a high potential driving voltage Vdd and a low potential driving voltage may be supplied to the pixel P from a power generating unit. Furthermore, the pixel P can include the organic light emitting diode, the driving TFT, first and second switching TFTs, and a storage capacitor. At this time, the TFT in the pixel P may be P-type TFT or N-type TFT.

The reference voltage controlling unit 140 is connected to the plurality of the reference voltage lines R1, R2 . . . Rm to output the reference voltage controlling signal so that the reference voltage lines R1, R2 . . . Rm are grounded or floated.

A VSS electrode 142 for receiving the low potential voltage or ground voltage is disposed in the lower region of the pixel P and the plurality of reference voltage lines R1,R2 . . . Rm in each pixel P are connected to the VSS electrode 142.

The data driving unit 130 generates a data voltage Vdata corresponding to a pixel data DATA in accordance with a data timing controlling signal DDC applied from the timing controller 104 and then the generated data voltage Vdata is supplied to each pixel P through the data line D1,D2 . . . Dm. The data driving unit 130 supplies the reference voltage Vref to each pixel P through the reference voltage line R1, R2 . . . Rm. Not shown in the drawings, the data driving unit 130 may include a plurality of data drive integrated circuits connected to the printed circuit board.

The gate driving unit 120 generates a gate signal based on a gate controlling signal inputted from the timing controller 104 and then the generated gate signal is supplied to the pixel through the gate line G1,G2 . . . Gn.

The timing controller 104 generates the data controlling signal DDC and the gate controlling signal GDC for controlling respectively the driving timings of the data driving unit 130 and the gate driving unit 120 to supply respectively the data controlling signal DDC and the gate controlling signal GDC to the data driving unit 130 and the gate driving unit 120.

Figure 3:
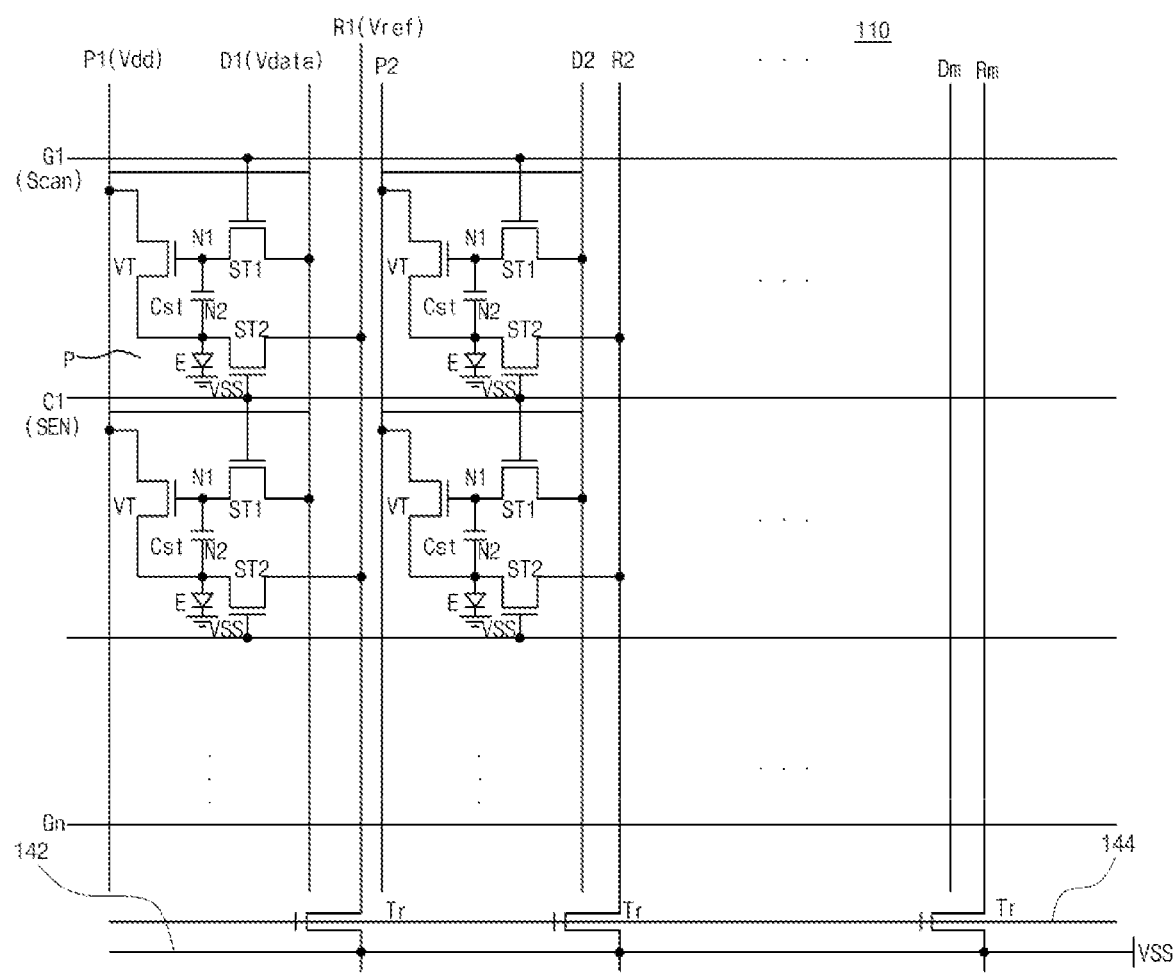
FIG. 3 is a view showing a circuit diagram of the pixels in the organic light emitting display device according to the first aspect of the disclosure.

FIG. 3 is a view showing a circuit diagram of the pixel P in the organic light emitting display panel 110 according to the first aspect of the disclosure.

As shown in FIG. 3, the display panel includes the plurality of pixels P of matrix form. The organic light emitting diode E, the driving TFT VT, the storage capacitor Cst, the first switching TFT ST1, the second switching TFT ST2 are disposed in each of the plurality of pixels P. However, the structure of pixel P of the disclosure is not limited to this structure. In the disclosure, that is, TFTs of 4 or more are disposed in each pixel P.

The organic light emitting diode E includes an anode electrode connected to a second node N2, a cathode electrode connected to the input of the low potential driving voltage VSS, and an organic light emitting layer between the anode electrode and the cathode electrode.

The driving current supplied to the organic light emitting diode E is controlled by the driving TFT VT according to the voltage Vgs between the gate and the source thereof. The driving TFT VT includes the gate electrode connected to the first node N1, the drain electrode connected to the input of the high potential driving voltage Vdd, and the source electrode connected to the second node N2.

The storage capacitor Cst is connected to the first node N1 and the second node N2. The first switching TFT ST1 responds to the gate signal Scan to supply the data voltage Vdata of the first data line D1 to the first node N1. The first switching TFT ST1 includes the gate electrode connected to the gate line G1, G2, G3 . . . , the drain electrode connected to the data line D1, D2, D3 . . . , and the source electrode connected to the first node N1.

The second switching TFT ST2 responds to the sensing signal SEN to switch the current flow between the second node N2 and the reference voltage line R1 so that the reference voltage Vref of reference voltage line R1 is supplied to the second node N2. The second switching TFT ST2 includes the gate electrode connected to the sensing line C1, C2, C3 . . . , the drain electrode connected to the reference voltage line R1, R2, R3 . . . , and the source electrode connected to the second node N2.

Not shown in the drawings, the data lines D1, D2 . . . Dm and the reference voltage line R1, R2 . . . Rm are connected to the data driving unit. The data driving unit converts the digital video data DATA inputted from the timing controller into the analog data voltage Vdata and then the supplies the converted data voltage Vdata to the data line D1,D2 . . . Dm. Furthermore, the data driving unit converts the digital reference voltage inputted from the timing controller into the analog reference voltage Vref and then supplies the converted reference voltage Vref to the reference voltage line R1, R2 . . . Rm.

In the lower region of the display panel 110, the VSS electrode 142 for receiving the low potential voltage VSS or the ground voltage is disposed and the plurality of reference voltage lines R1,R2 . . . Rm are connected to the VSS electrode 142. At this time, the reference voltage controlling TFT Tr is provided at each of the reference voltage lines R1, R2 . . . Rm so that the reference voltage lines R1, R2 . . . Rm are disconnected from the VSS electrode 142 to float the reference voltage lines R1, R2 . . . Rm or the reference voltage lines R1, R2 . . . Rm are connected to the VSS electrode 142 to ground the reference voltage lines R1, R2 . . . Rm.

Although not shown in the drawings, the VSS electrode is also connected to the cathode electrode of the light emitting diode E and thus the plurality of the reference voltage lines R1, R2 . . . Rm may be made at the same potential, and the low potential voltage may be applied to the cathode electrode.

The light emitting diode E includes the anode electrode, the cathode electrode, and the organic light emitting layer therebetween. The anode electrode is a pixel electrode disposed in each pixel P to which the data voltage Vdata is supplied. The cathode electrode is a common electrode disposed in the entire pixels P of the display panel 110 to which the low potential voltage VSS is applied.

Thus, the cathode electrode is disposed in the whole area of the display panel 110. Further, the cathode electrode is also disposed in the whole area of the pad region (or outer region) at the outside of the display region so that the low potential voltage is supplied to the cathode electrode in the display region. The VSS electrode 142 may be composed of a part of the cathode electrode at the pad region or the outer region.

The reference voltage control line 144 connected to the reference voltage controlling unit 140 is disposed at the lower end region of the display panel 110. The reference voltage controlling TFT Tr includes the gate electrode connected to the reference voltage control line 144, the source electrode connected to each of the reference voltage lines R1, R2 . . . Rm, and the drain electrode connected to the VSS electrode 142.

The reference voltage control line 144 is connected to the reference voltage controlling unit 140 to supply the controlling signal Vr outputted from the reference voltage controlling unit 140 to the reference voltage controlling TFT Tr through the reference voltage controlling line 144 to connect or disconnect the reference voltage line R1, R2 . . . Rm to the VSS electrode 142 in order to ground or float the reference voltage line R1, R2 . . . Rm.

As described above, in the disclosure, the VSS electrode 142 of low potential is provided to connect the plurality of reference voltage lines R1, R2 . . . Rm thereto so that the reference voltage lines R1, R2 . . . Rm can be kept uniform, for the following reasons:

In general, in the organic light emitting display device, the pixel P including the organic light emitting diode E are arranged in a matrix form, and the luminance of the pixel P is controlled according to the gray level of the video data. This luminance is controlled by controlling the driving current supplied to the organic light emitting diode E by the driving TFT VT. However, in the organic light emitting display device, there are variations in characteristics such as threshold voltage and electron mobility of the driving TFT VT between the pixels P because of the process tolerances or process errors, thereby the image quality of the organic light emitting display device is deteriorated.

In order to prevent the deterioration of the image quality, the electrical characteristic of the driving TFT VT disposed at each pixel P is sensed. The data voltage Vdata is compensated according to the sensing value of the electrical characteristic of the driving TFT VT and then supplied to the pixel P. The compensated data voltage Vdata is supplied to the driving TFT VT through the data line D1,D2 . . . Dm.

Meanwhile, the reference voltage Vref is supplied to the source electrode of the driving TFT DT through the reference voltage line R1,R2 . . . Rm. The data lines D1,D2 . . . Dm and the reference voltage lines R1,R2 . . . Rm are individually connected to the data driving unit. Specially, the reference voltage lines R1,R2 . . . Rm serve as sensing output lines which transfer the sensing voltages obtained from the pixel P to the data driving circuit when sensing the electrical characteristic deviation of the driving TFT VT.

Since the reference voltage Vref is the reference for determining the voltage Vgs between the gate and the source of the driving TFT VT, the level of the reference voltage must always remain uniform. However, the reference voltage Vref is distorted by the coupling with the data lines D1,D2 . . . Dm. Since the data lines D1,D2 . . . Dm and the reference voltage line R1,R2 . . . Rm are disposed adjacent to each other, that is, the coupling is generated between the data lines D1,D2 . . . Dm and the reference voltage line R1,R2 . . . Rm. in particular, this coupling becomes large when the data voltage Vdata supplied to the data lines D1,D2 . . . Dm is varied to display the desired gray. For this reason, the reference voltage Vref applied through the reference voltage lines R1,R2 . . . Rm is also distorted by the coupling, thereby degrading the image quality.

In other word, even in case where the data voltage Vdata is compensated by sensing deviation of the electrical characteristics of the driving TFT VT, the reference voltage Vref is distorted by the coupling between the data lines D1,D2 .

. . Dm and the reference voltage lines R1,R2 . . . Rm and thus there was a limit to preventing deterioration of image quality.

In the disclosure, the plurality of reference voltage lines R1,R2 . . . Rm are connected to the VSS electrode 142 and the reference voltage lines R1,R2 . . . Rm are grounded or floated by turning on or off the reference voltage controlling TFT Tr to prevent the distortion of the reference voltage Vref.

The reason why the distortion occurs in the reference voltage Vref is that the strength of the coupling between the data lines D1,D2 . . . Dm and the reference voltage lines R1,R2 . . . Rm is different when the data voltage supplied to the data lines D1,D2 . . . Dm is varied to display the desired grey and thus the potentials applied to the plurality of the reference voltage lines R1,R2 . . . Rm are different.

In order to prevent the deterioration caused by the deviation of the reference voltage Vref, in the disclosure, the reference voltage lines R1,R2 . . . Rm are grounded by shorting-circuit the reference voltage lines R1,R2 . . . Rm with the VSS electrode 142 to equalize the reference voltages Vref supplied to the plurality of the reference voltage lines R1,R2 . . . Rm when the driving TFT VT is driven by supplying the date voltage Vdata from the data lines D1,D2 . . . Dm, that is, when organic light emitting diode E is emitting.

Figure 4:
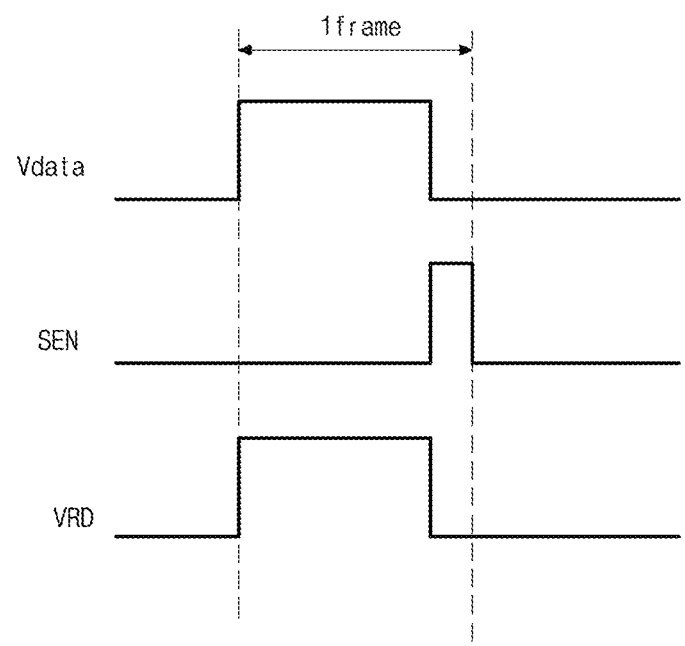
FIG. 4 is a signal diagram of the organic light emitting display device according to the first aspect of the disclosure.

As shown in FIG. 4, the data voltage Vdata is supplied to the driving TFT VT during the setting period of one frame of the image and the sensing signal SEN is supplied to the second switching TFT ST2 during the remaining period. When one frame is about 8.333 ms, for example, the data voltage Vdata may be supplied to the driving TFT VT for about 8.0 ms and the sensing signal SEN may be supplied to the second switching TFT ST2 for about 0.333 ms. However, the driving period and the sensing period are not limited to a specific time but may be variously set.

The controlling signal Vr is supplied to the reference voltage controlling TFT Tr in synchronization with the data voltage Vdata. During light emitting period of the organic light emitting diode E, in which the driving TFT VT is driven, in one frame period, the controlling signal Vr is supplied to the reference voltage controlling TFT Tr. By this controlling signal, all of the reference voltage controlling TFTs Tr connected to a plurality of the reference voltage lines R1, R2 . . . Rm is turned on.

Accordingly, the reference voltage lines R1,R2 . . . Rm are electrically connected to the VSS electrode 142 so that the reference voltage lines R1,R2 . . . Rm are all grounded or a low potential voltage is applied thereto. Since all reference voltage lines R1,R2 . . . Rm have the same potential, the magnitude of the coupling between the date lines D1, D2 . . . Dm and the reference voltage lines R1,R2 . . . Rm are always the same when the data voltage Vdata supplied to the data lines D1,D2 . . . Dm is varied. Therefore, even when the driving TFT VT is turned on by the data voltage Vdata, the deterioration of the organic light emitting display device 100 due to the distortion of the reference voltage Vref does not occur.

Since all the reference voltage controlling TFTs Tr connected to a plurality of the reference voltage lines R1, R2 . . . Rm are turned off and then all the reference voltage lines R1,R2 . . . Rm are disconnected from the VSS electrode 142 in the sensing period that the sensing signal SEN is supplied to the second switching TFT ST2, all the reference voltage lines R1,R2 . . . Rm are floating. Thus, each of the plurality of reference voltage lines R1,R2 . . . Rm can transfer the sensing voltage obtained from the corresponding pixel P to the data driving unit.

As described above, in the disclosure, the reference voltage lines R1,R2 . . . Rm are connected to the VSS electrode 142. Thereafter, the reference voltage lines R1,R2 . . . Rm are connected to the VSS electrode 142 to ground thereof in the light emitting period of organic light emitting diode E so that the potentials of all the reference voltage lines R1,R2 . . . Rm are equalized to prevent the deterioration of the image quality caused by the distortion of the reference voltage Vref. Further, the reference voltage lines R1,R2 . . . Rm are disconnected from the VSS electrode 142 in the sensing period and then the reference voltage lines R1,R2 . . . Rm are floating for good sensing.

On the other hand, the best way to prevent image deterioration due to distortion of the reference voltage Vref is to directly compensate for the distorted reference voltage. However, in this case, since a separate external compensation circuit should be necessary to compensate the reference voltage, the circuit configuration becomes complicated and the manufacturing cost increases.

On the contrary, in the disclosure, since only the reference voltage control TFT Tr for shorting circuit and disconnecting the reference voltage lines R1,R2 . . . Rm with the VSS electrode 142 is necessary, the circuit configuration is simplified and the manufacturing cost is reduced.

Figure 5:
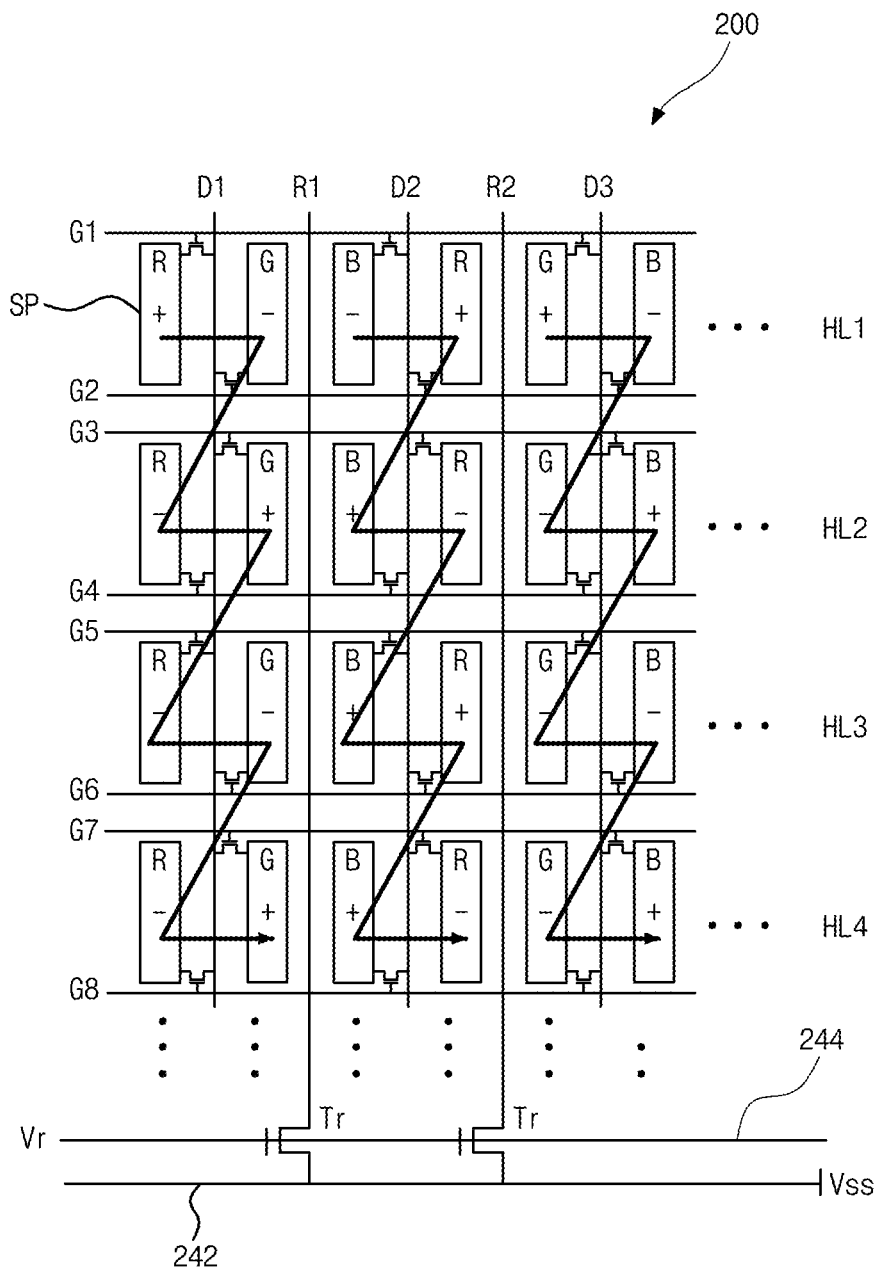
FIG. 5 is a view showing an arrangement of the pixels in the organic light emitting display device according to a second aspect of the disclosure.

FIG. 5 is a schematic view of an organic light emitting display device 200 according to a second aspect of the disclosure. In this drawing, only R, G, B-sub pixels constituting one pixel, the gate lines G1, G2 . . . Gn, the data lines D1, D2 . . . Dm, and the reference voltage lines R1,R2 . . . Rm are illustrated for convenience of description. In this case, the structure of each of the R, G, and B-sub pixels may be the same as that of the pixel illustrated in FIG. 3.

As shown in FIG. 5, the organic light emitting display device 200 of this aspect is the organic light emitting display device of DRD (Double Rate Driving) driving mode having R, G, B-sub pixels SP.

In the organic light emitting display device, the data driving unit supplying the various signal such as the data voltage Vdata and the reference voltage Vref is composed of an integrated circuit element which is expensive compared to other elements. In order to reduce the production cost of the organic light emitting display device, the method of reducing the number of the data driving units has been actively studied. As one method of the various methods of reducing the number of the data driving units, the DRD driving mode has been proposed. In the DRD driving mode which is driving method capable of implementing the same resolution as the prior organic light emitting display device, the number of data line is reduced by ½ instead of doubling the number of gate lines by 2 times so that the number of the data driving units can be reduced by ½.

As shown in FIG. 5, in the organic light emitting display device 200 of DRD driving mode, two sub-pixels SP share one data line D1, D2 . . . Dm and adjacent sub-pixels SP sharing one data line D1, D2 . . . Dm are respectively connected to the different gate lines G1, G2 . . . Gn. Thus, a plurality of sub-pixels SP disposed on one horizontal line HL are driven using two gate lines and ½ data line.

In other word, the organic light emitting display device 200 of DRD driving mode according to the disclosure is driven by a two horizontal dot inversion driving mode that R, G, and B sub-pixels SP are sequentially arranged and two sub-pixels SP are connected to one data line D1,D2 . . . Dm.

R sub-pixel connected to the odd-numbered gate line G1,G3,G5 . . . is adjacent to G sub-pixel connected to the even-numbered gate line G2,G4,G6 . . . , and these R sub-pixel and G sub-pixel are commonly connected to the first data line D1. B sub-pixel connected to the odd-numbered gate line G1,G3,G5 . . . is adjacent to R sub-pixel connected to the even-numbered gate line G2,G4,G6 . . . , and these B sub-pixel and R sub-pixel are commonly connected to the second data line D2. G sub-pixel connected to the odd-numbered gate line G1,G3,G5 . . . is adjacent to B sub-pixel connected to the even-numbered gate line G2,G4,G6 . . . , and these G sub-pixel and B sub-pixel are commonly connected to the third data line D3.

In this organic light emitting display device 200 according to this aspect, the arrangement of R, G, B-sub pixels SP is repeated in whole area of the display device.

In the organic light emitting display device 200 of DRD driving mode, depending on the connection method and the charging order of the sub-pixels SP to the gate lines G1,G2 . . . Gn and the data lines D1,D2 . . . Dm, not only sub pixel SP is fully charged with the data voltage and but also the sub pixel SP is not fully charged with the data voltage. These strong charging (full charging) and weak charging (non-full charging) causes the difference in luminance of the image in the corresponding sub pixel SP.

In particular, when a plurality of the sub-pixels SP of a specific color are all weakly charged or a relatively large number of the sub-pixels SP are weakly charged among all the sub-pixels SP arranged along the vertical direction, the luminance of the specific color in this region is lower than that of the corresponding color in other region. Accordingly, dark lines of low luminance are displayed along the vertical direction and thus dim defect appears on the screen.

In order to prevent the dim defect, in the organic light emitting display device 200 according to this aspect, the organic light emitting display device 200 is driven in the specific manner. This driving manner will be described accompanying FIGS. 5 and 6.

Figure 6:
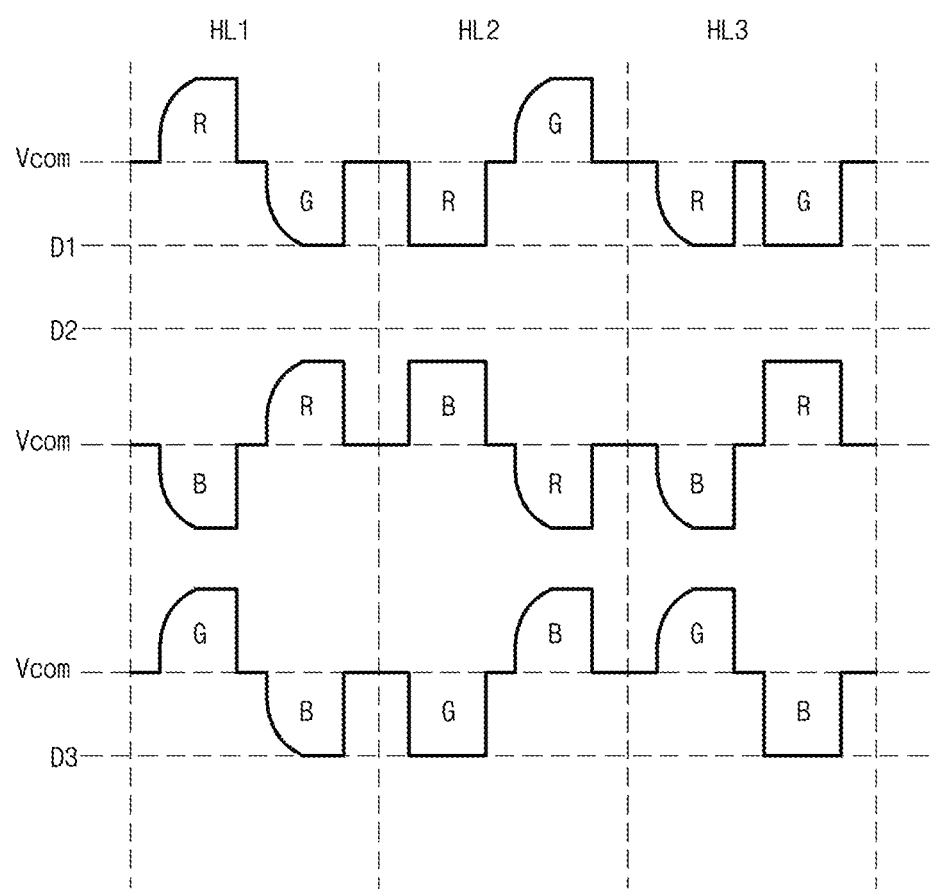
FIG. 6 is a view showing a driving method of the organic light emitting display device according to the second aspect of the disclosure.

As shown in FIGS. 5 and 6, when the organic light emitting display device 200 is driven in the two horizontal dots driving mode, the gate signal Scan of high is supplied to the first gate line G1 to enable the first horizontal line HL1. In synchronization with this, furthermore, the positive data voltage Vdata is supplied to the odd-numbered data lines D2n-1 (where n is a natural number), and the negative data voltage Vdata is supplied to the even-numbered data lines DL2n to charge weakly the odd numbered sub-pixels SP.

Thereafter, the gate signal Scan of low is supplied to the first gate line G1 to disable the first horizontal line HL1 and the gate signal Scan of high is supplied to the third gate line G3 to enable the second horizontal line HL2. In synchronization with this, the positive data voltage Vdata is supplied to the odd-numbered data lines D2n-1 and the negative data voltage Vdata is supplied to the even-numbered data lines DL2n to charge strongly the even numbered sub-pixels SP.

Subsequently, the gate signal Scan of low is supplied to the third gate line G3 to disable the second horizontal line HL2 and the gate signal Scan of high is supplied to the fifth gate line G5 to enable the third horizontal line HL3. In synchronization with this, the negative data voltage Vdata is supplied to the odd-numbered data lines D2n-1 and the positive data voltage Vdata is supplied to the even-numbered data lines DL2n to charge weakly the odd numbered sub-pixels SP.

When the charging is completed to the last horizontal line in this manner, the second gate line G2 of the first horizontal line HL1 is again enabled to weakly charge the even-numbered sub-pixel SP, and then this process is repeated.

As shown in FIG. 6, if this process is repeated, the ratios of the weak charging and the strong charging of the R, G, B sub-pixels SP along the longitudinal direction are similar, not only the weak charging or the strong charging of the R, G, B sub-pixels SP. Thus, since the charging deviation does not occur in the entire sub-pixels SP of the display device, it is possible to prevent the dim defects.

Meanwhile, in this aspect, the data voltage Vdata can be charged in the sub-pixels by the various methods. For example, the R, G, B sub-pixels SP are arranged in the various manner, and then the gate signal Scan and the data voltage Vdata are supplied in the different order depending on the arrangement of the R, G, B sub-pixels SP, thereby the charging deviation does not occur in all the sub-pixels SP of the display device.

In this process, because of the 2 dot-inversion driving mode, the reference voltage Vref may be distorted by the coupling between the data lines D1,D2 . . . and the reference voltage lines R1, R2 . . . even when the charging deviation of the vertically arranged R, G, B sub-pixels SP is removed. As a result, the driving current applied to the organic light emitting diode E may be distorted by the distortion of the reference voltage.

Accordingly, even in case where the deviation of charging mount of the data voltage Vdata supplied to the sub-pixels arranged along the longitudinal direction is not occurred, it is impossible to maintain the uniform level of the driving current to be supplied to the organic light emitting diode E by the distortion of the reference voltage Vref.

In this aspect, the reference voltage lines R1,R2 . . . are formed to supply the reference voltage Vref to the pixel having R, G, B sub-pixels. That is, the plurality of the reference voltage lines R1,R2 . . . may be respectively disposed between the data lines D1,D2 . . . , for example, between the G sub-pixel connected to the first data line D1 and the B sub-pixel connected to the second data line D2, and between the R sub-pixel connected to the second data line D2 and the G sub-pixel connected to the third data line D3.

In the lower region of the organic light emitting display device 200, VSS electrode 242 for receiving the low potential voltage VSS or the ground voltage is formed and the plurality of the reference voltage lines R1,R2 . . . are connected to the VSS electrode 242. Further, the reference voltage controlling TFT Tr is disposed in on the each of the reference voltage lines R1,R2 . . . and the reference voltage controlling TFT Tr is turned on or turned off in accordance with the controlling signal supplied through the reference voltage controlling line 244. As the reference voltage controlling TFT Tr is turned on or turned off, the reference voltage lines R1,R2 . . . are shorted or disconnected from the VSS electrode 242, so that the reference voltage lines R1,R2 . . . are floated or the reference voltage lines R1,R2 . . . are connected to the VSS electrode 242.

In particular, the reference voltage lines R1,R2 . . . are connected to the VSS electrode 242 to ground the reference voltage lines R1,R2 . . . in the emitting period of the organic light emitting diode E and thus all the reference voltage lines R1,R2 . . . have same potential so that the distortion of the reference voltage Vref by the coupling and the deterioration of the image quality can be prevented. In the sensing period, furthermore, the reference voltage lines R1,R2 . . . are disconnected from the VSS electrode 242 and thus the reference voltage lines R1,R2 . . . are floated for good sensing.

Figure 7:
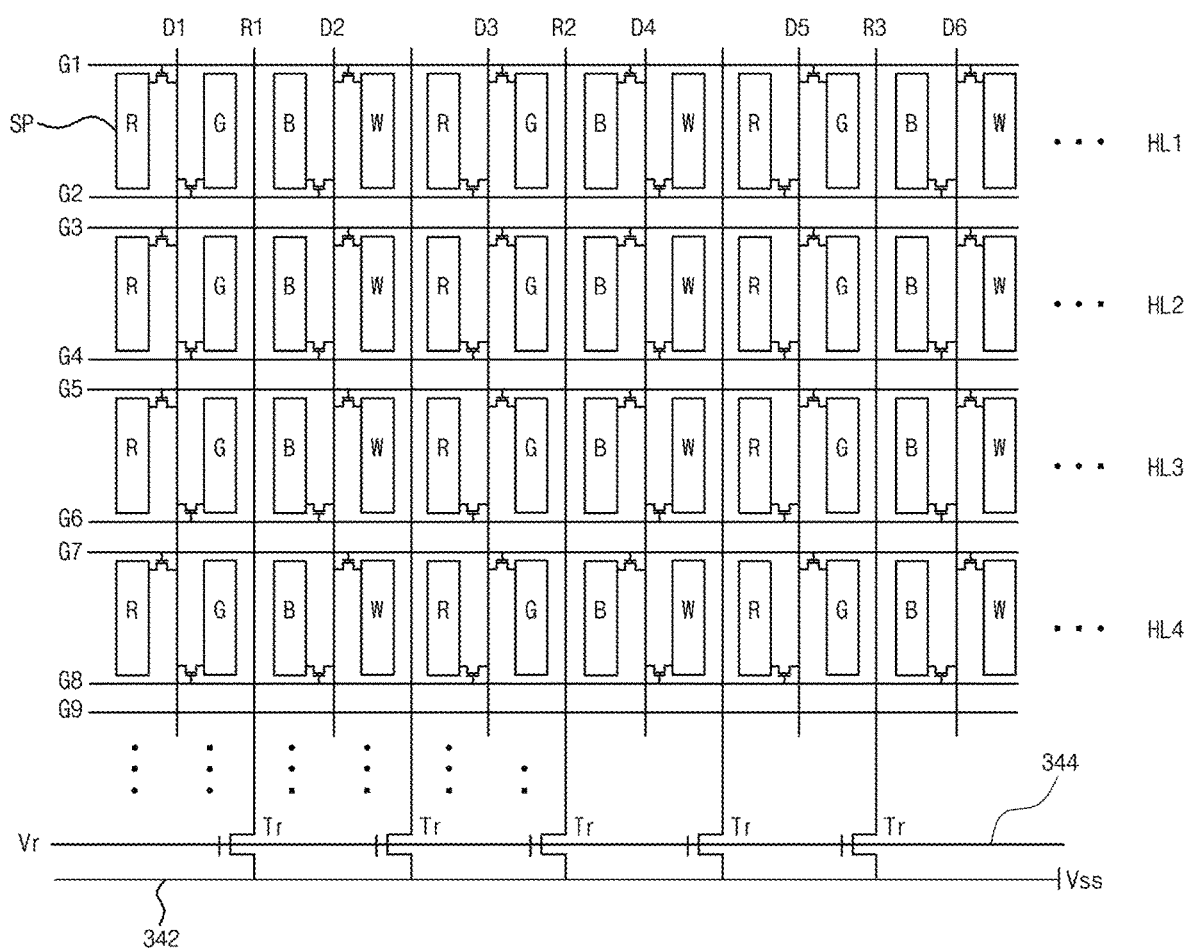
FIG. 7 is a view showing an arrangement of the pixels in the organic light emitting display device according to a third aspect of the disclosure.

FIG. 7 is a schematic view of an organic light emitting display device 300 according to a third aspect of the disclosure. In this figure, only R, G, B-sub pixels constituting one pixel, the gate lines G1, G2 . . . Gn, the data lines D1,D2 . . . Dm, and the reference voltage lines R1,R2 . . . Rm are illustrated for convenience of description.

As shown in FIG. 7, the organic light emitting display device 300 of this aspect includes a plurality of R sub-pixels, G sub-pixels, B sub-pixels, and W (White) sub-pixels. The plurality of the data lines D1,D2 . . . and the gate lines G1,G2 . . . are disposed in the organic light emitting display device 300 to drive the sub-pixels arranged on the horizontal lines.

R sub-pixel connected to the odd-numbered gate line G1,G3,G5 . . . is adjacent to G sub-pixel connected to the even-numbered gate line G2,G4,G6 . . . , and these R sub-pixel and G sub-pixel are commonly connected to the first data line D1. B sub-pixel connected to the even-numbered gate line G2,G4,G6 . . . is adjacent to W sub-pixel connected to the odd-numbered gate line G1,G3,G5 . . . , and these B sub-pixel and W sub-pixel are commonly connected to the second data line D2.

R sub-pixel connected to the even-numbered gate line G2,G4,G6 . . . is adjacent to G sub-pixel connected to the odd-numbered gate line G1,G3,G5 . . . , and these R sub-pixel and G sub-pixel are commonly connected to the third data line D3. B sub-pixel connected to the odd-numbered gate line G1,G3,G5 . . . is adjacent to W sub-pixel connected to the even-numbered gate line G2,G4,G6 . . . , and these B sub-pixel and W sub-pixel are commonly connected to the fourth data line D4.

R sub-pixel connected to the even-numbered gate line G2,G4,G6 . . . is adjacent to G sub-pixel connected to the odd-numbered gate line G1,G3,G5 . . . , and these R sub-pixel and G sub-pixel are commonly connected to the fifth data line D5. B sub-pixel connected to the even-numbered gate line G2,G4,G6 . . . is adjacent to W sub-pixel connected to the odd-numbered gate line G1,G3,G5 . . . , and these B sub-pixel and W sub-pixel are commonly connected to the sixth data line D6.

The plurality of the reference voltage lines R1, R2 . . . is disposed in the pixel P to supply respectively the reference voltages Vref to the R, G, B, W sub-pixels SP. The plurality of the reference voltage lines R1,R2 . . . may be respectively disposed between the odd-numbered data lines D1, D3, D5 . . . and the even-numbered data lines D2,D4,D6 . . . , that is, disposed in the middle region of 4 sub-pixels SP constituting the pixel P.

In the lower region of the display device 300, the VSS electrode 342 for receiving the low potential voltage VSS or the ground voltage is disposed and the plurality of reference voltage lines R1,R2,R3 . . . are connected to the VSS electrode 342.

The reference voltage controlling TFT Tr is disposed on each of the plurality of the reference voltage lines R1, R2,R3 . . . to turn on or off the reference voltage controlling TFT Tr by the controlling signal Vr supplied from the reference voltage controlling unit through the reference voltage controlling line 344. By turning on or turning off the reference voltage controlling TFT Tr, all the reference voltage lines R1,R2,R3 . . . are short-circuited or disconnected from the VSS electrode 342.

The organic light emitting display device according to this aspect is driven in the 4-dot inversion mode. A plurality of first left sub-pixels and first right sub-pixels, in which the first data line D1 is disposed therebetween, are charged in order of 2 first left sub-pixels, 4 first right sub-pixels, 4 first left sub-pixels, . . . , and 2 first right sub-pixels. A plurality of second left sub-pixels and second right sub-pixels, in which the second data line D2 is disposed therebetween, are charged in order of 2 second right sub-pixels, 4 second left sub-pixels, 4 second right sub-pixels, . . . , and 2 second left sub-pixels.

Further, a plurality of third left sub-pixels and third right sub-pixels, in which the third data line D3 is disposed therebetween, are charged in order of 1 third right sub-pixel, 3 third left sub-pixels, 3 third right sub-pixels, . . . , and 1 third left sub-pixel. A plurality of fourth left sub-pixels and fourth right sub-pixels, in which the fourth data line D4 is disposed therebetween, are charged in order of 1 fourth left sub-pixel, 3 fourth right sub-pixels, 3 fourth left sub-pixels, . . . , and 1 fourth right sub-pixel.

In this aspect, as described above, a plurality of sub-pixels are charged in the vertical direction (i.e., an extension direction of the data line) and a plurality of sub-pixels adjacent in the horizontal direction are charged so that the ratios of weak charging and strong charging of the R, G, B, and W sub-pixels SP are almost similar along the longitudinal direction and thus the dim defect caused by the charging deviation can be prevented.

Meanwhile, the R, G, B, W subpixels of the disclosure are not limited to being arranged as shown in the drawings but may be arranged in various manners. For example, the sub-pixels SP may be arranged in order of RGBW in the odd-numbered horizontal directions HL1,HL3 . . . and the sub-pixels SP may be arranged in order of BWRG in the even-numbered horizontal directions HL2,HL4 . . . . In this case, also, by adjusting the order of charging the sub-pixels, the ratios of weak charging and strong charging of the R, G, B, and W sub-pixels SP can be substantially similar along the longitudinal direction.

In the organic light emitting display device 300 of this aspect, the charging deviation of R, G, B, W sub-pixels arranged in the longitudinal direction is removed by driving in the 4-dot inversion mode along the longitudinal direction. However, the reference voltage Vref is distorted by the coupling between the date lines D1,D2 and the reference voltage lines R,R2 . . . and the driving current supplied to the organic light emitting diode E is distorted by the distortion of the reference voltage Vref. Specially, the distortion of the reference voltage Vref due to the coupling is further increased by applying the data voltage Vdata in a 4-dot inversion manner along the extending direction of the data lines D1, D2 . . . .

Therefore, even in case where no variation occurs in the charge amount of the data voltage Vdata supplied to the R, G, B, W sub-pixels SP arranged along the longitudinal direction, the driving current supplied to the organic light emitting diode E cannot maintain the uniform level by the distortion of the reference voltage Vref.

In this aspect, the VSS electrode 342 for receiving the low potential voltage VSS or the ground voltage is also disposed in the lower region of the display device 300 and the plurality of reference voltage lines R1, R2 . . . which are respectively formed in the pixel having R, G, B, W sub-pixels are connected to the VSS electrode 342. Further, the reference voltage controlling TFT Tr is disposed on the each of the reference voltage lines R1, R2 . . . and the reference voltage lines R1, R2 . . . are shorted-circuit or disconnected from the VSS electrode 342, so that the reference voltage lines R1, R2 . . . are floated or the reference voltage lines R1, R2 . . . are connected to the VSS electrode 342.

In particular, the reference voltage lines R1,R2 . . . are connected to the VSS electrode 342 to ground thereof in the light emitting period of organic light emitting diode E so that the potentials of all the reference voltage lines R1,R2 . . . are equalized to prevent the deterioration of the image quality caused by the distortion of the reference voltage Vref. Further, the reference voltage lines R1,R2 . . . are disconnected from the VSS electrode 342 in the sensing period and then the reference voltage lines R1,R2 . . . are floating for good sensing.

In the disclosure, as described above, the VSS electrode connected to the reference voltage line is disposed in the organic light emitting display device to short circuit the reference voltage line and the VSS electrode according to the controlling signal so that the deviation of the level of the reference voltage by the coupling between the data line and the reference voltage line can be prevented when the organic light emitting diode is emitting. As a result, it is possible to prevent the deterioration of the image quality due to the level deviation of the reference voltage.

In the above detailed description, an organic light emitting display device having a specific structure has been described as an example. However, the disclosure is not limited to the organic light emitting display device having a specific structure, but may be applied to various organic light emitting display devices. Therefore, the scope of the disclosure should be determined by the appended claims, not by the above detailed description.

What is claimed is:

1. An organic light emitting display device comprising:
   a display panel having a plurality of gate lines and data lines defining a plurality of sub-pixels;
   an organic light emitting device disposed in each sub-pixel;
   a driving thin film transistor disposed in each sub-pixel;
   a plurality of reference voltage lines disposed on the display panel to apply a reference voltage to the sub-pixels; and
   a VSS electrode disposed on a side of the display panel to apply a VSS voltage to the reference voltage lines,
   wherein, during a light emitting period, the plurality of reference voltage lines are connected to the VSS electrode for receiving the VSS voltage that equalizes all potentials of the plurality of reference voltage lines, and
   wherein, during a sensing period, the plurality of reference voltage lines are disconnected from the VSS electrode for floating that enables the plurality of reference voltage lines to transfer a sensing voltage obtained from the plurality of sub-pixels to a data driving unit.

2. The organic light emitting display device of claim 1, wherein the plurality of sub-pixels is driven in a double rate driving (DRD) mode that neighboring two sub-pixels are connected to one data line and two gate lines.

3. The organic light emitting display device of claim 2, wherein the sub-pixels includes R (Red), G (Green), and B (Blue) sub-pixels.

4. The organic light emitting display device of claim 2, wherein the sub-pixels includes R (Red), G (Green), B (Blue), and W (White) sub-pixels.

5. The organic light emitting display device of claim 1, further comprising a plurality of reference voltage controlling thin film transistors disposed respectively at the reference voltage lines.

6. The organic light emitting display device of claim 5, further comprising a plurality of reference voltage controlling lines for receiving a reference voltage controlling signal,
   wherein the reference voltage controlling thin film transistors includes a gate electrode connected to the reference voltage controlling line, a source electrode connected to the reference voltage line, and a drain electrode connected to the VSS electrode.

7. The organic light emitting display device of claim 6, wherein the reference voltage controlling thin film transistor is turned on to ground the reference voltage line when the driving thin film transistor is driven and the reference voltage controlling thin film transistor is turned off to float the reference voltage line when the driving thin film transistor is not driven.

8. The organic light emitting display device of claim 1, wherein a ground voltage is applied to the VSS electrode.

9. The organic light emitting display device of claim 1, wherein a low potential voltage is applied to the VSS electrode.

10. The organic light emitting display device of claim 1, further comprising a sensing line connected to each of sub-pixels to supply a sensing signal for sensing the characteristic of the driving thin film transistor to the corresponding sub-pixel.

11. The organic light emitting display device of claim 10, wherein the reference voltage line outputs a sensing voltage detected from the driving thin film transistor.

12. An organic light emitting display device comprising:
    a plurality of gate lines and data lines disposed on a display panel and defining a plurality of sub-pixels;
    an organic light emitting device disposed in each sub-pixel;
    a driving thin film transistor disposed in each sub-pixel;
    a plurality of reference voltage lines disposed on the display panel and the sub-pixels applied with a reference voltage through the plurality of reference voltage lines;
    a VSS electrode disposed on the display panel for applying a VSS voltage to the plurality of reference voltage lines; and
    a plurality of reference voltage controlling lines for receiving a reference voltage controlling signal controlling connections between the plurality of reference voltage lines and the VSS electrode;
    wherein, during a light emitting period, the plurality of reference voltage lines are connected to the VSS electrode for receiving the VSS voltage that equalizes all potentials of the plurality of reference voltage lines, and
    wherein, during a sensing period, the plurality of reference voltage lines are disconnected from the VSS electrode for floating that enables the plurality of reference voltage lines to transfer a sensing voltage obtained from the plurality of sub-pixels to a data driving unit.

13. The organic light emitting display device of claim 12, wherein the plurality of sub-pixels is driven in a double rate driving (DRD) mode that neighboring two sub-pixels are connected to one data line and two gate lines.

14. The organic light emitting display device of claim 13, wherein the sub-pixels includes R (Red), G (Green), and B (Blue) sub-pixels.

15. The organic light emitting display device of claim 13, wherein the sub-pixels includes R (Red), G (Green), B (Blue), and W (White) sub-pixels.

16. The organic light emitting display device of claim 12, further comprising a plurality of reference voltage controlling thin film transistors disposed respectively at the reference voltage lines.

17. The organic light emitting display device of claim 16, wherein the reference voltage controlling thin film transistors includes a gate electrode connected to the reference voltage controlling line, a source electrode connected to the reference voltage line, and a drain electrode connected to the VSS electrode.

18. The organic light emitting display device of claim 17, wherein the reference voltage controlling thin film transistor is turned on to ground the reference voltage controlling line when the driving thin film transistor is driven and the reference voltage controlling thin film transistor is turned off to float the reference voltage controlling line when the driving thin film transistor is not driven.

19. The organic light emitting display device of claim 12, wherein a ground voltage is applied to the VSS electrode.

20. The organic light emitting display device of claim 12, wherein a low potential voltage is applied to the VSS electrode.

21. The organic light emitting display device of claim 12, further comprising a sensing line connected to each of sub-pixels to a sensing signal for sensing the characteristic of the driving thin film transistor to the corresponding sub-pixel.

\* \* \* \* \*